(12) United States Patent
Kabir (10) Patent No.: US 10,535,649 B2
(45) Date of Patent: Jan. 14, 2020

(54) ENHANCED LAYOUT OF MULTIPLE-FINGER ELECTROSTATIC DISCHARGE (ESD) PROTECTION DEVICE

(71) Applicant: Intersil Americas LLC, Milpitas, CA (US)

(72) Inventor: Abu T. Kabir, West Melbourne, FL (US)

(73) Assignee: Intersil Americas LLC, Milpitas, CA (US)

( * ) Notice: Subject to any disclaimer, the term of this patent is extended or adjusted under 35 U.S.C. 154(b) by 275 days.

(21) Appl. No.: 15/492,918

(22) Filed: Apr. 20, 2017

(65) Prior Publication Data

US 2017/0309614 A1    Oct. 26, 2017

Related U.S. Application Data

(60) Provisional application No. 62/478,461, filed on Mar. 29, 2017, provisional application No. 62/327,726, filed on Apr. 26, 2016.

(51) Int. Cl.
*H01L 27/02* (2006.01)
*H01L 29/10* (2006.01)
(Continued)

(52) U.S. Cl.
CPC ...... *H01L 27/0266* (2013.01); *H01L 21/8222* (2013.01); *H01L 21/823475* (2013.01);
(Continued)

(58) Field of Classification Search
USPC ................... 361/56, 91.1, 111; 257/355–360
See application file for complete search history.

(56) References Cited

U.S. PATENT DOCUMENTS

2002/0033507 A1*  3/2002  Maria Verhaege .........................
                                        H01L 27/0266
                                                257/360
2009/0315146 A1*  12/2009  Vashchenko ........ H01L 27/0259
                                                257/579
(Continued)

OTHER PUBLICATIONS

Denison, Marie et al., "Analysis and modeling of DMOS FBSOA limited by n-p-n leakage diffusion current", Proceedings of the 17th International Symposium on Power Semiconductor Devices & IC's, May 23-26, 2005, 4 pages.
(Continued)

*Primary Examiner* — Danny Nguyen
(74) *Attorney, Agent, or Firm* — Foley & Lardner LLP (57) ABSTRACT

An enhanced layout for a multiple-finger ESD protection device has several embodiments. In these embodiments, the base contacts of the NPN (or PNP) transistors utilized as voltage clamps in the multiple-finger NPN-based (or PNP-based) multiple-finger ESD protection device are disposed at opposite edges of the multiple-finger ESD protection device and oriented perpendicularly to the orientation of the fingers in the multiple-finger ESD protection device. Similarly, the body contacts of the NMOS (or PMOS) transistors utilized as voltage clamps in the multiple-finger NMOS-based (or PMOS-based) multiple-finger ESD protection device are disposed at opposite edges of the multiple-finger ESD protection device and oriented perpendicularly to the orientation of the fingers in the multiple-finger ESD protection device.

20 Claims, 4 Drawing Sheets

(51) Int. Cl.
*H01L 21/8234* (2006.01)
*H01L 21/8222* (2006.01)
*H01L 29/423* (2006.01)

(52) U.S. Cl.
CPC ...... *H01L 27/0207* (2013.01); *H01L 27/0259* (2013.01); *H01L 29/1095* (2013.01); *H01L 29/42304* (2013.01)

(56) References Cited

U.S. PATENT DOCUMENTS

| | | | |
|---|---|---|---|
| 2014/0177113 A1* | 6/2014 | Gueorguiev | H01L 27/0248 361/56 |
| 2015/0022921 A1* | 1/2015 | Vinson | H01L 27/0262 361/56 |

OTHER PUBLICATIONS

Rumennik, Vladimir et al., "Integrated High and Low Voltage CMOS Technology", 1982 International Electron Devices Meeting, Dec. 13-15, 1982, 4 pages.

\* cited by examiner

ENHANCED LAYOUT OF MULTIPLE-FINGER ELECTROSTATIC DISCHARGE (ESD) PROTECTION DEVICE

CROSS-REFERENCE TO RELATED APPLICATIONS

This application claims priority to U.S. Provisional Patent Application Ser. No. 62/327,726, filed on Apr. 26, 2016, and to U.S. Provisional Patent Application Ser. No. 62/478,461, filed on Mar. 29, 2017, the contents of all such applications being incorporated herein by reference in their entirety.

TECHNICAL FIELD

The present embodiments relate generally to electrostatic discharge (ESD) protection, and more particularly to an enhanced layout of an ESD protection device for an integrated circuit.

BACKGROUND

Metal-Oxide Semiconductor Field-Effect Transistor (MOSFET) and bipolar junction transistor (BJT) devices are often utilized for Electrostatic Discharge (ESD) protection within CMOS integrated circuits to clamp any large ESD-induced voltage pulse to a level low enough to avoid damaging the semiconductor devices and/or metal interconnects in the integrated circuit chips involved. However, existing bipolar- and MOSFET-based clamps utilized for ESD protection are incapable of protecting any semiconductor device that has a turn-on voltage that is lower than the trigger voltage of the ESD clamp being utilized.

SUMMARY

Embodiments provide an enhanced layout for a multiple-finger ESD protection device. In one exemplary embodiment, the multiple-finger ESD protection device includes a plurality of MOSFET devices, such as, for example, a plurality of grounded-gate NMOS (ggNMOS) transistor devices connected in parallel. In another embodiment, the MOSFET device includes a plurality of ggPMOS transistor devices. In yet another embodiment, the multiple-finger ESD protection device includes a plurality of NPN transistor devices connected in parallel. In still another embodiment, the multiple-finger ESD protection device includes a plurality of PNP transistor devices connected in parallel. In any event, the base contacts of the NPN (or PNP) transistors utilized as voltage clamps in the multiple-finger NPN-based (or PNP-based) multiple-finger ESD protection device are disposed at opposite edges of the multiple-finger ESD protection device and oriented perpendicularly to the orientation of the fingers in the multiple-finger ESD protection device. Similarly, the body contacts of the NMOS (or PMOS) transistors utilized as voltage clamps in the multiple-finger NMOS-based (or PMOS-based) multiple-finger ESD protection device are disposed at opposite edges of the multiple-finger ESD protection device and oriented perpendicularly to the orientation of the fingers in the multiple-finger ESD protection device.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

Metal-Oxide Semiconductor Field-Effect Transistor (MOSFET) and bipolar junction transistor (BJT) devices are often utilized for Electrostatic Discharge (ESD) protection within CMOS integrated circuits to clamp any large ESD-induced voltage pulse to a level low enough to avoid damaging the semiconductor devices and/or metal interconnects in the integrated circuit chips involved. However, existing bipolar- and MOSFET-based clamps utilized for ESD protection are incapable of protecting any semiconductor device that has a turn-on voltage that is lower than the trigger voltage of the ESD clamp being utilized. Consequently, the semiconductor devices and thus the integrated circuit chips being protected can fail if an ESD event occurs.

Multiple-finger ESD protection devices including multiple voltage clamps connected in parallel can be utilized to achieve much higher ESD current conduction performance than individual clamps. However, existing high voltage (e.g., >20V) NPN and NMOS-type ESD clamps exhibit high snap-back behavior and have low holding voltages (e.g., <5V below their trigger voltages). Consequently, individual NPN- and NMOS-type high voltage clamps utilized in existing multiple-finger ESD protection devices can conduct inadvertently, and thus the ESD current is not distributed uniformly through the multiple fingers during an ESD event. Therefore, both the conducting finger(s) and the multiple-finger ESD protection device can fail as a result. Nevertheless, as described below, notwithstanding the above-described problems with existing bipolar- and MOSFET-based ESD clamps, the present invention resolves these and other related problems with a novel layout method and structure for multiple finger bipolar- and MOSFET-based ESD clamps that can be triggered uniformly during an ESD event.

Embodiments of the present invention provide an enhanced layout for a multiple-finger ESD protection device. In one exemplary embodiment, the multiple-finger ESD protection device includes a plurality of MOSFET devices, such as, for example, a plurality of grounded-gate NMOS (ggNMOS) transistor devices connected in parallel. In another embodiment, the MOSFET device includes a plurality of ggPMOS transistor devices. In yet another embodiment, the multiple-finger ESD protection device includes a plurality of NPN transistor devices connected in parallel. In still another embodiment, the multiple-finger ESD protection device includes a plurality of PNP transistor devices connected in parallel. In any event, the base contacts of the NPN (or PNP) transistors utilized as voltage clamps in the multiple-finger NPN-based (or PNP-based) multi-plefinger ESD protection device are disposed at opposite edges of the multiple-finger ESD protection device and oriented perpendicularly to the orientation of the fingers in the multiple-finger ESD protection device. Similarly, the body contacts of the NMOS (or PMOS) transistors utilized as voltage clamps in the multiple-finger NMOS-based (or PMOS-based) multiple-finger ESD protection device are disposed at opposite edges of the multiple-finger ESD protection device and oriented perpendicularly to the orientation of the fingers in the multiple-finger ESD protection device. Consequently, in accordance with the teachings of the present application, each finger in the multiple-finger ESD protection device will have the same base resistance or body resistance, and the maximum resistance will be at the center of each finger. Therefore, since all of the fingers have the same resistance, all of the fingers will turn on simultaneously if an ESD event occurs, which functions to ensure the uniform triggering of the individual clamps and thus maximize the current-carrying capability of the ESD protection device involved.

Figure 1:
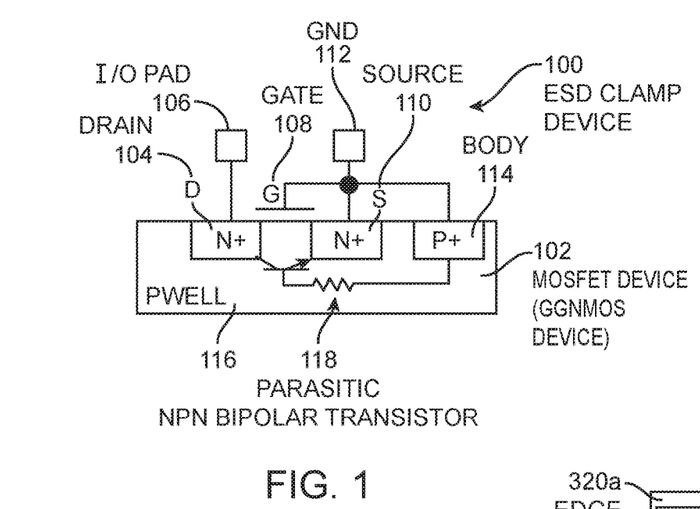
FIG. 1 depicts a side elevation, cross-sectional view of an exemplary ESD clamp device that can be utilized in a multiple-finger ESD protection device to implement one exemplary embodiment.

FIG. 1 depicts a side elevation, cross-sectional view of an exemplary ESD clamp device 100, which can be utilized in a multiple-finger ESD protection device to implement one exemplary embodiment of the present invention. Referring to FIG. 1, the exemplary ESD clamp device 100 includes a MOSFET device 102. For this embodiment, the MOSFET device 102 is a ggNMOS transistor device. However, in another embodiment, any suitable MOS transistor device (e.g., NMOS or PMOS) can be utilized to implement the MOSFET device 102. For example, the MOSFET device 102 can be a P-MOSFET device instead of an N-MOSFET device, if the beta value of the corresponding parasitic PNP bipolar transistor in the ggPMOS transistor is sufficiently high. Returning to FIG. 1, the drain terminal 104 of the MOSFET device 102 is connected to an input/output (I/O) pad 106, and the gate terminal 108 and source terminal 110 of the MOSFET device 102 are connected to a reference potential, e.g., ground, contact 112. For example, the I/O pad 106 can be connected to an input port or pin of an integrated circuit to be protected from an ESD event (e.g., static discharge on that port or pin).

The MOSFET device 102 is formed in a lightly doped, deep P-well region 116 that isolates the MOSFET device 102 from an N-type semiconductor substrate (i.e., P-type background doping). For example, the P-well region 116 can be formed by implanting dopants into a surface of a region or layer of semiconductor material having an N-type conductivity utilizing a suitable implantation process. However, if the MOSFET device 102 is a ggPMOS transistor device in a different embodiment, the MOSFET device 102 could be formed in a lightly doped, deep N-well region that would isolate the MOSFET device 102 from a P-type semiconductor substrate (N-type background doping).

For this embodiment, the drain 104 of the MOSFET device 102 has an N+ conductivity and is connected to the I/O pad 106. The gate 108 of the MOSFET device 102 is connected to the ground contact 112, which in turn, can be connected to the circuit ground of the integrated circuit to be protected from an ESD event. The source 110 of the MOSFET device 102 has an N+ conductivity and is also connected to the ground contact 112. The body 114 of the MOSFET device 102 has a P+ conductivity and is coupled via a parasitic NPN bipolar transistor 118 to I/O pad 106 and the ground contact 112. Notably, during an occurrence of an ESD event, the drain 104, gate 108 and source 110, respectively, form the collector, base and emitter of the parasitic NPN bipolar transistor 118 in the ggNMOS transistor device 102 when the ggNMOS transistor device 102 is triggered and turned on.

In an exemplary operation of the ESD clamp device 100, referring to FIG. 1, if no ESD event has occurred in the circuit being protected (e.g., "normal" operation), the ESD clamp device 100 remains "off" (e.g., inactive or non-conducting) while the gate-to-source voltage, Vgs, of the MOSFET device 102 remains substantially equal to 0V. However, if an ESD event occurs (e.g., static discharge) on the protected integrated circuit's input (or output) pin connected to the I/O pad 106, the parasitic NPN bipolar transistor 118 formed by the drain 104 (i.e. collector of parasitic transistor 118), body 114 (i.e., base of parasitic transistor 118) and source 110 (i.e., emitter of parasitic transistor 118) is turned "on" (e.g., active or conducting) when the voltage across the drain-to-body junction of the MOSFET device 102 reaches the avalanche breakdown voltage level. At that point, the ESD clamp device 100 is triggered "on" and couples the ESD current from the I/O pad 106 to the ground contact 112.

Figure 2:
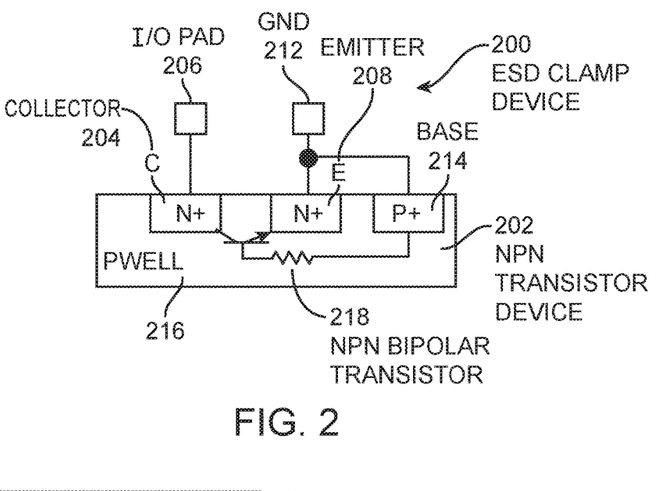
FIG. 2 depicts a side elevation, cross-sectional view of an exemplary ESD clamp device that can be utilized in a multiple-finger ESD protection device to implement a second exemplary embodiment.

FIG. 2 depicts a side elevation, cross-sectional view of an exemplary ESD clamp device 200, which can be utilized in a multiple-finger ESD protection device to implement a second exemplary embodiment of the present invention. Referring to FIG. 2, the exemplary ESD clamp device 200 includes an NPN transistor device 202. For this embodiment, an NPN transistor device 202 is utilized for the ESD clamp device 200. However, in another embodiment, any suitable PNP transistor device can be utilized to implement the ESD clamp device 200. Returning to FIG. 2, the collector terminal 204 of the ESD clamp device 200 is connected to an input/output (I/O) pad 206, and the emitter terminal 208 and base terminal 214 of the ESD clamp device 200 are connected to the reference potential, e.g., ground contact 212. For example, the I/O pad 206 can be connected to an input port or pin of an integrated circuit to be protected from an ESD event (e.g., static discharge on that port or pin), and the ground contact 212 can be connected to a ground pin of the integrated circuit.

The NPN transistor device 102 is formed in a lightly doped, deep P-well region 216 that isolates the NPN transistor device 202 from an N-type semiconductor substrate (i.e., P-type background doping). For example, the P-well region 216 can be formed by implanting dopants into a surface of a region or layer of semiconductor material having an N-type conductivity utilizing a suitable implantation process. However, if the ESD clamp device 200 utilizes a PNP transistor device in a different embodiment, the PNP transistor device could be formed in a lightly doped, deep N-well region that would isolate the PNP transistor device 202 from a P-type semiconductor substrate (N-type background doping).

For this embodiment, the collector 204 of the NPN transistor device 202 has an N+ conductivity and is connected to the I/O pad 206. The emitter 208 also has an N+ conductivity of the NPN transistor device 202 is connected to the ground contact 212, which in turn, can be connected to the circuit ground of the integrated circuit to be protected from an ESD event. The base 214 of the NPN transistor device 202 has a P+ conductivity and is also connected to the ground contact 212. The base 214 is coupled via a bipolar transistor 218 to the I/O pad 206 and the ground contact 212. Notably, during an occurrence of an ESD event, when the voltage across the collector-to-base junction of the bipolar transistor 218 reaches the avalanche breakdown voltage level, the ESD clamp device 200 is triggered "on" to conduct and thus couples the ESD current from the I/O pad 206 to the ground contact 212.

Figure 3:
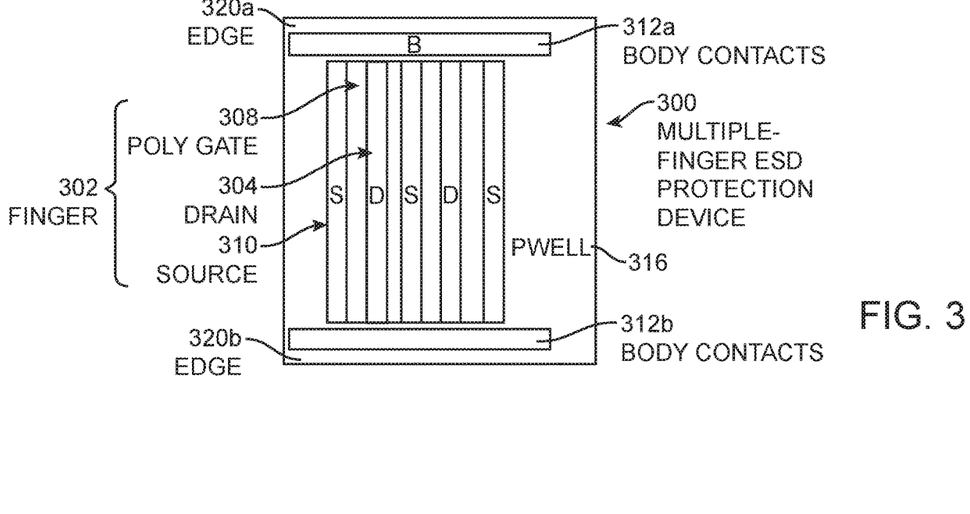
FIG. 3 depicts a top down view of an exemplary multiple-finger ESD protection device that can be utilized to implement one exemplary embodiment.

FIG. 3 depicts a top down view of an exemplary multiple-finger ESD protection device 300, which can be utilized to implement one exemplary embodiment of the present invention. Referring to FIG. 3, the exemplary multiple-finger ESD protection device 300 includes a plurality of ESD voltage clamps (e.g., plurality of ESD clamp devices 100 depicted in FIG. 1). As such, as depicted in FIG. 3, each ESD voltage clamp of the plurality of ESD voltage clamps is utilized to form a finger of the multiple-finger ESD protection device 300. For example, an exemplary finger 302 of the plurality of fingers of the multiple-finger ESD protection device 300 depicted in FIG. 3 includes a MOSFET device (e.g., 102 in FIG. 1) having a drain 304, a polysilicon gate 308, and a source 310. The multiple fingers are formed in a lightly doped, deep P-well region 316 (e.g., P-well region 116 in FIG. 1). For this exemplary embodiment, each finger (e.g., finger 302) of the multiple fingers depicted in FIG. 3 is formed adjacent to and parallel with at least one other finger. In the embodiment depicted in FIG. 3, the multiple fingers are vertically oriented (in the plane defined by the surface of the sheet depicting FIG. 3). The multiple-finger ESD protection device 300 also includes a plurality of body contacts 312a, 312b formed at opposite edges 320a, 320b of the multiple-finger ESD protection device 300. For this embodiment, the body contacts 312A, 312B can include, for example, a plurality of body contacts connected to a plurality of the body terminals 114 depicted in FIG. 1. In the embodiment depicted in FIG. 3, the body contacts 312A, 312B are formed perpendicularly to the orientation of the multiple fingers (e.g., finger 302). As such, the body contacts 312a, 312b are horizontally oriented (in the plane defined by the surface of the sheet depicting FIG. 3). Notably, in accordance with the teachings of the present application, orienting the body contacts 312a, 312b perpendicularly to the orientation of the multiple fingers (e.g., 302) ensures that all of the fingers of the multiple-finger ESD protection device 300 have equal body resistances, and the maximum resistance of each finger is at its center region. Therefore, during an ESD event (e.g., electrostatic discharge), all of the fingers of the multiple-finger ESD protection device 300 are uniformly triggered to turn on virtually simultaneously, which functions to evenly distribute the ESD current though the multiple fingers, maximize the current-carrying capability of the ESD protection device, and thereby enhance the overall ESD protection performance of the ESD protection device.

Figure 4:
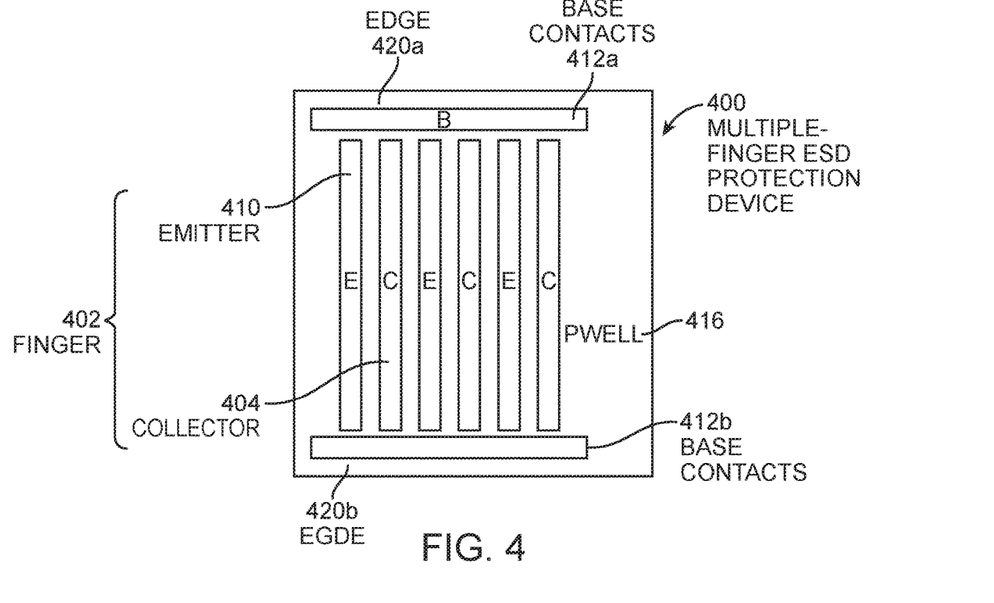
FIG. 4 depicts a top down view of an exemplary multiple-finger ESD protection device that can be utilized to implement a second exemplary embodiment.

FIG. 4 depicts a top down view of an exemplary multiple-finger ESD protection device 400, which can be utilized to implement a second exemplary embodiment of the present invention. Referring to FIG. 4, the exemplary multiple-finger ESD protection device 400 includes a plurality of ESD voltage clamps (e.g., plurality of ESD clamp devices 200 depicted in FIG. 2). As such, as depicted in FIG. 4, each ESD voltage clamp of the plurality of ESD voltage clamps is utilized to form a finger of the multiple-finger ESD protection device 400. For example, an exemplary finger 402 of the plurality of fingers of the multiple-finger ESD protection device 400 depicted in FIG. 4 includes an NPN transistor device (e.g., 202 in FIG. 2) having a collector 404 and an emitter 410. For this exemplary embodiment, each finger (e.g., finger 402) of the multiple fingers depicted in FIG. 4 is formed adjacent to and parallel with at least one other finger. The multiple fingers are formed in a lightly doped, deep P-well region 416 (e.g., P-well region 216 in FIG. 2). In the embodiment depicted in FIG. 4, the multiple fingers are vertically oriented (in the plane defined by the surface of the sheet depicting FIG. 4). The multiple-finger ESD protection device 400 also includes a plurality of base contacts 412a, 412b formed at opposite edges 420a, 420b of the multiple-finger ESD protection device 400. For this embodiment, the base contacts 412a, 412b can include, for example, a plurality of base contacts connected to a plurality of the base terminals 214 depicted in FIG. 2. In the embodiment depicted in FIG. 4, the base contacts 412a, 412b are formed perpendicularly to the orientation of the multiple fingers (e.g., finger 402). As such, the base contacts 412a, 412b are horizontally oriented (in the plane defined by the surface of the sheet depicting FIG. 4). Notably, in accordance with the teachings of the present application, orienting the base contacts 412a, 412b perpendicularly to the orientation of the multiple fingers (e.g., 402) ensures that all of the fingers of the multiple-finger ESD protection device 400 have equal body resistances, and the maximum resistance of each finger is at its center region. Therefore, during an ESD event (e.g., electrostatic discharge), all of the fingers of the multiple-finger ESD protection device 400 are uniformly triggered to turn on virtually simultaneously, which functions to evenly distribute the ESD current though the multiple fingers, maximize the current-carrying capability of the ESD protection device, and thereby enhance the overall ESD protection performance of the ESD protection device.

Figure 5:
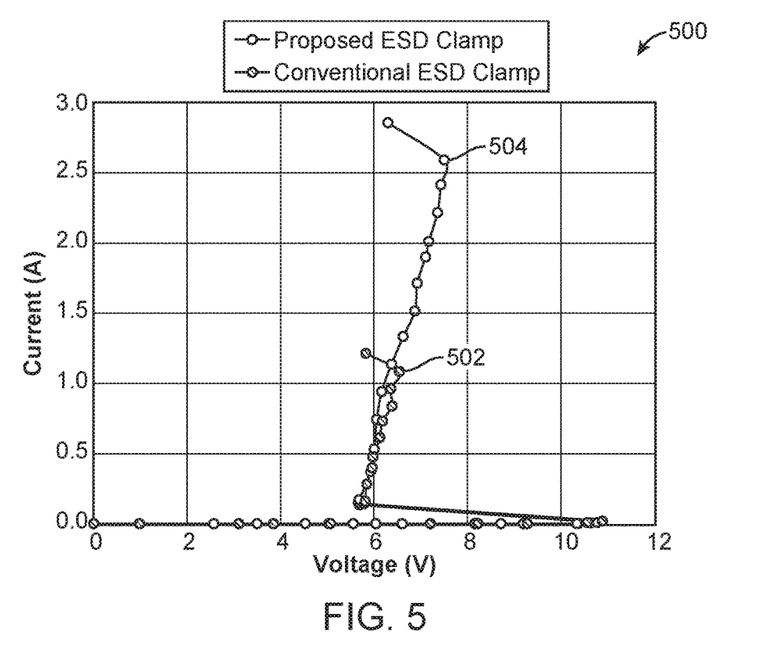
FIG. 5 is a diagram depicting exemplary Transmission Line Pulse (TLP) current (A) versus voltage (V) measurement curves that can be applied to a multiple-finger ESD protection device, which is configured in accordance with one exemplary embodiment.

FIG. 5 is a diagram 500 depicting exemplary Transmission Line Pulse (TLP) current (A) versus voltage (V) measurement curves that can be applied to a multiple-finger ESD protection device, which is configured in accordance with one exemplary embodiment of the present invention. For example, the diagram 500 depicted in FIG. 5 indicates at point 502 that as the voltage (V) of the conventional multiple-finger clamp device being utilized was increased from about 5.8V to about 6.2V, the maximum current through the device reached to a maximum of about 1.1 A where the device failed. However, at point 504, the diagram 500 indicates that as the voltage (V) of the multiple-finger NPN transistor ESD protection device being utilized, which was configured in accordance with the teachings of the present application, was increased from about 5.8V to about 7.8V, the maximum current through the multiple-finger NPN transistor-based ESD protection device increased to about 2.6 A, or approximately twice that of the conventional device where the device failed.

Figure 6:
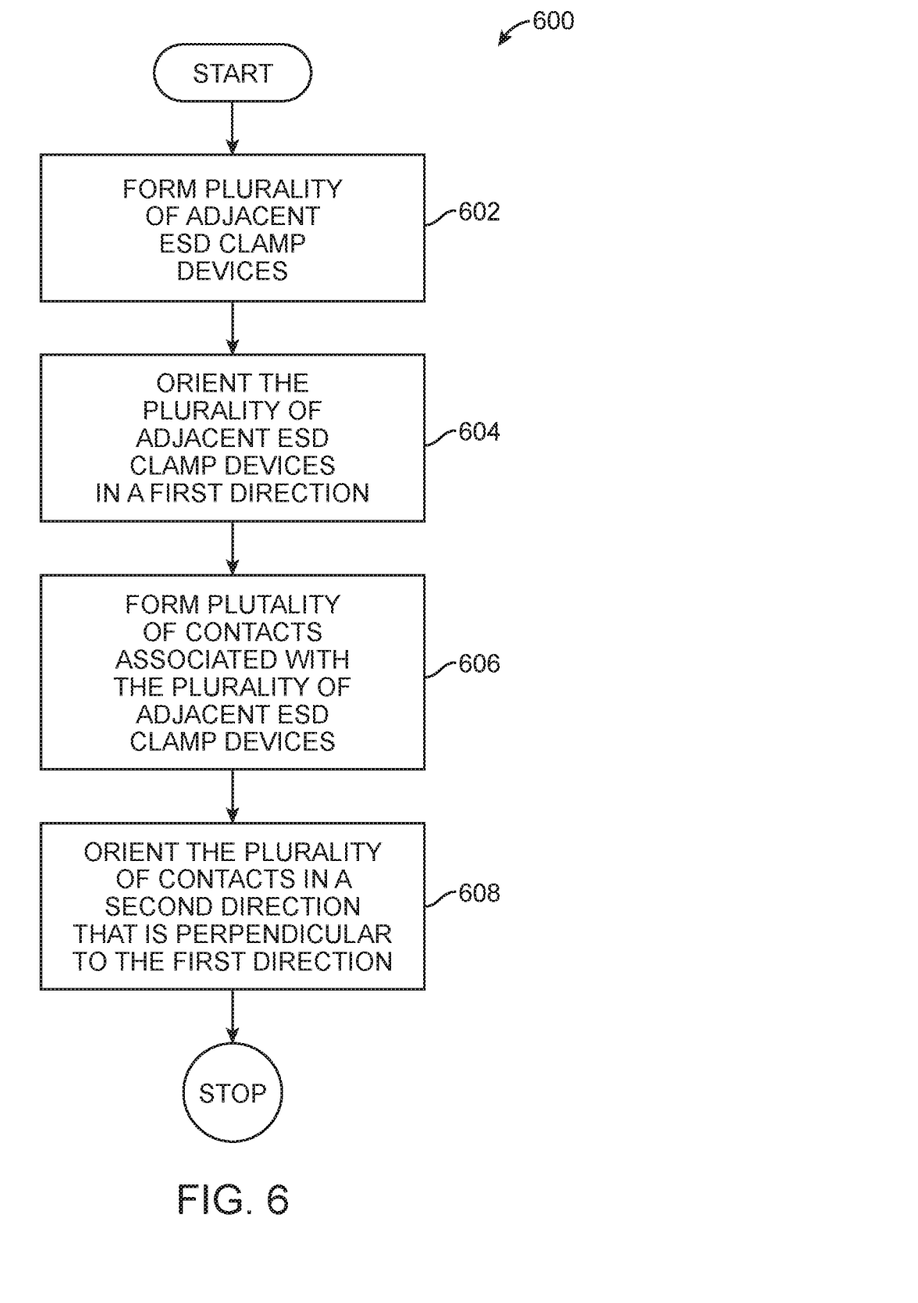
FIG. 6 depicts a flow diagram of a method of manufacture of a multiple-finger ESD protection device, in accordance with one exemplary embodiment.

FIG. 6 depicts a flow diagram of a method of manufacture 600 of a multiple-finger ESD protection device, in accordance with one exemplary embodiment of the present invention. Referring to FIGS. 1 through 4 for this exemplary embodiment, the method 600 begins by forming a plurality of adjacent ESD clamp devices (e.g., 100, 200) into a multiple-finger ESD protection device (602). The plurality of adjacent ESD clamp devices of the multiple-finger ESD protection device are then oriented in a first direction (604). The method continues by forming a plurality of contacts (e.g., 312a, 312b, 412a, 412b) associated with the plurality of adjacent ESD clamp devices at two opposite edges of the multiple-finger ESD protection device (606). Next, the plurality of contacts at the two opposite edges of the multiple-finger ESD protection device are oriented in a second direction that is perpendicular to the first direction (608). Consequently, the method of orienting the contacts perpendicularly to the orientation of the multiple fingers ensures that all of the fingers of the multiple-finger ESD protection device have equal body resistances, and the maximum resistance of each finger is at its center region. Therefore, the method 600 ensures that during an ESD event (e.g., static discharge), all of the fingers of the multiple-finger ESD protection device are uniformly triggered to turn on virtually simultaneously, which functions to evenly distribute the ESD current though the multiple fingers, maximize the current-carrying capability of the ESD protection device, and thereby enhance the overall ESD protection performance of the ESD protection device.

Figure 7:
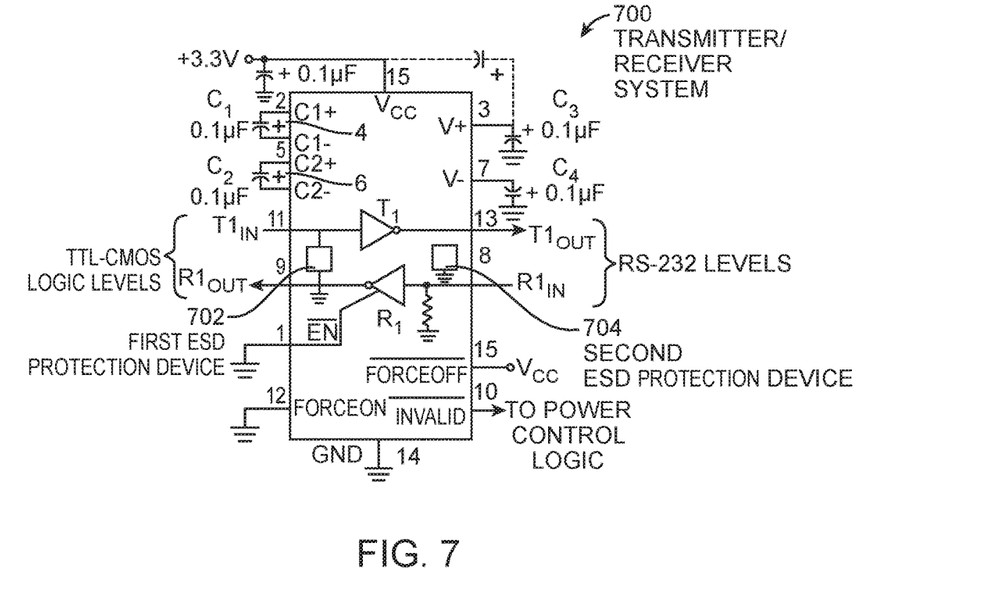
FIG. 7 depicts a schematic, block diagram of an exemplary transmitter/receiver system that can be utilized to implement a multiple-finger ESD protection device, in accordance with one or more embodiments.

FIG. 7 depicts a schematic, block diagram of an exemplary transmitter/receiver system 700 that can be utilized to implement a multiple-finger ESD protection device, in accordance with one or more embodiments of the present invention. In some embodiments, transmitter/receiver system 700 can be implemented as a semiconductor IC or chip. Referring to FIG. 7 for one exemplary embodiment, transmitter/receiver system 700 includes a transmitter T1 and a receiver R1. In other embodiments, transmitter/receiver system 700 can include a plurality of transmitters and receivers in a semiconductor IC or chip. In any event, the I/O pads (e.g., 106 in FIG. 1 or 206 in FIG. 2) of the multiple fingers of the ESD protection device 702 are connected to the input connection T1IN of the transmitter T1, and the reference, e.g., ground, contacts (e.g., contacts 112 in FIG. 1 or 212 in FIG. 2) of the first multiple-finger ESD protection device 702 are coupled to circuit ground 14. Also, the I/O pads of a second multiple-finger ESD protection device 704 are connected to the output connection T1OUT of the transmitter T1, and the contacts of the second multiple-finger ESD protection device 704 are coupled to a reference potential, e.g., circuit ground 14. Furthermore, a plurality of other multiple-finger ESD protection devices can be connected to other circuit components of the transmitter/receiver system 700 between their respective pin connections and the reference potential, e.g., ground. If an ESD event occurs on the input connection T1IN or the output connection T1OUT, for example, the corresponding multiple-finger ESD protection device is triggered and turned on.

Figure 8:
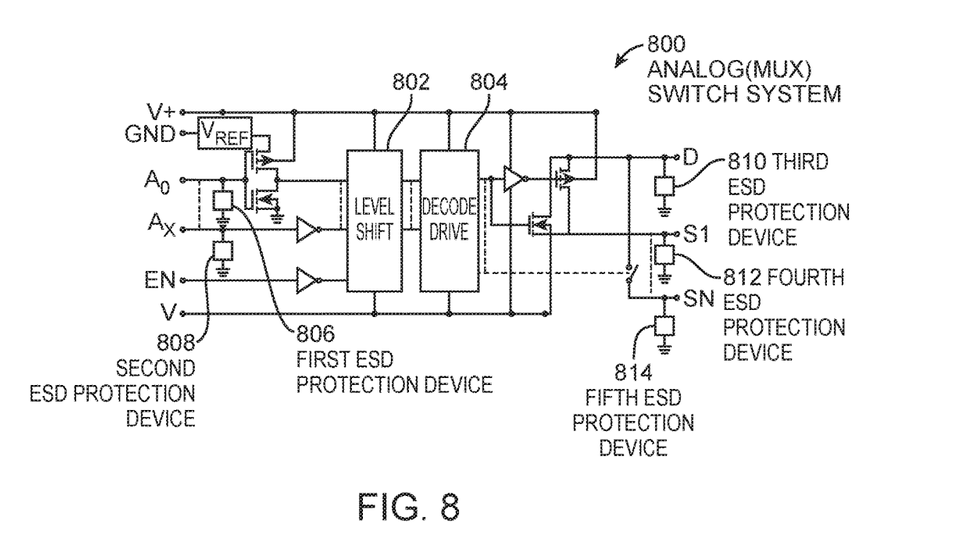
FIG. 8 depicts a schematic, block diagram of an exemplary analog switch configured as a multiplexer/demultiplexer (e.g., MUX switch) system that can be utilized to implement a multiple-finger ESD protection device, in accordance with one or more embodiments.

FIG. 8 depicts a schematic, block diagram of an exemplary analog switch configured as a multiplexer/demultiplexer (e.g., MUX switch) system 800 that can be utilized to implement a multiple-finger ESD protection device, in accordance with one or more embodiments of the present invention. In some embodiments, MUX switch system 800 can be implemented on a semiconductor IC or chip. Referring to FIG. 8 for one exemplary embodiment, MUX switch system 800 includes (among other components) a level shift 702 and a decoder/driver 704. In the exemplary embodiment shown, the I/O pads (e.g., 106 in FIG. 1 or 206 in FIG. 2) of a first multiple-finger ESD protection device 806 are connected to the input connection $A_0$, and the reference contacts (e.g., 112 in FIG. 1 or 212 in FIG. 2) of the first multiple-finger ESD protection device 806 are connected to a reference potential, e.g., circuit ground. Also, the I/O pads of a second multiple-finger ESD protection device 808 are connected to the input connection $A_X$, and the reference contacts of the second multiple ESD protection device are connected to a reference potential, e.g., circuit ground. Additional multiple-finger ESD protection devices can be connected between each of the other input connections $A_1$ to $A_{X-1}$ and the reference potential, e.g., circuit ground. For example, a third multiple-finger ESD protection device 810 is connected between the main output connection D and the reference potential, e.g., circuit ground, a fourth multiple-finger ESD protection device 812 is connected between the main multiplexor connection $S_1$ and the reference potential, e.g., circuit ground, and a fifth multiple-finger ESD protection device 814 is connected between the main multiplexor connection $S_N$ and the reference potential, e.g., circuit ground. Additional multiple-finger ESD protection devices can be connected between the other main multiplexor connections $S_2$ to $S_{N-1}$ and the reference potential, e.g., circuit ground. Also, a plurality of other multiple-finger ESD protection devices can be connected to other circuit components of the MUX switch system 800 between their respective pin connections and the reference potential, e.g., ground. If an ESD event occurs on any one of the inputs or outputs shown, the attached multiple-finger ESD protection device is triggered and turned on.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A multiple-finger electrostatic discharge (ESD) protection device, comprising:
   a plurality of adjacent ESD clamp devices oriented in a first direction, wherein each ESD clamp device of the plurality of adjacent ESD clamp devices includes an input/output (I/O) pad and a contact configured to be coupled to a reference potential; and
   a plurality of the contacts associated with the plurality of adjacent ESD clamp devices, wherein the plurality of contacts is oriented in a second direction that is perpendicular to the first direction, and wherein each of the plurality of contacts is connected to two or more of the plurality of adjacent ESD clamp devices.

2. The multiple-finger ESD protection device of claim 1, wherein the plurality of adjacent ESD clamp devices comprises a plurality of fingers of the multiple-finger ESD protection device.

3. The multiple-finger ESD protection device of claim 1, wherein the plurality of adjacent ESD clamp devices comprises a plurality of MOSFET devices, and the plurality of contacts comprises a plurality of body contacts.

4. A multiple-finger electrostatic discharge (ESD) protection device, comprising:
   a plurality of adjacent ESD clamp devices oriented in a first direction, wherein each ESD clamp device of the plurality of adjacent ESD clamp devices includes an input/output (I/O) pad and a contact configured to be coupled to a reference potential; and
   a plurality of contacts associated with the plurality of adjacent ESD clamp devices, wherein the plurality of contacts is oriented in a second direction that is perpendicular to the first direction,
   wherein the plurality of adjacent ESD clamp devices comprises a plurality of NPN transistor devices, and the plurality of contacts comprises a plurality of base contacts.

5. The multiple-finger ESD protection device of claim 3, wherein the plurality of MOSFET devices comprises a plurality of grounded-gate NMOS (ggNMOS) transistor devices.

6. The multiple-finger ESD protection device of claim 3, wherein the plurality of MOSFET devices comprises a plurality of ggPMOS transistor devices.

7. The multiple-finger ESD protection device of claim 1, wherein the plurality of adjacent ESD clamp devices comprises a plurality of PNP transistor devices.

8. The multiple-finger ESD protection device of claim 1, wherein the plurality of contacts associated with the plurality of adjacent ESD clamp devices are arranged at two opposite edges of the multiple-finger ESD protection device.

9. The multiple-finger ESD protection device of claim 1, wherein the multiple-finger ESD protection device is formed on a semiconductor integrated circuit, wafer, chip or die.

10. A method of forming a multiple-finger ESD protection device, comprising:
    forming a plurality of adjacent ESD clamp devices;
    orienting the plurality of adjacent ESD clamp devices in a first direction;
    forming a plurality of contacts associated with the plurality of adjacent ESD clamp devices; and
    orienting the plurality of contacts in a second direction that is perpendicular to the first direction, wherein each of the plurality of contacts is formed and oriented to be connected to two or more of the plurality of adjacent ESD clamp devices.

11. The method of claim 10, wherein the forming the plurality of adjacent ESD clamp devices comprises forming a plurality of adjacent ggNMOS transistor devices.

12. The method of claim 10, wherein the forming the plurality of adjacent ESD clamp devices comprises forming a plurality of adjacent MOSFET devices.

13. The method of claim 10, wherein the forming the plurality of adjacent ESD clamp devices comprises forming a plurality of adjacent NPN transistor devices.

14. The method of claim 10, wherein the forming the plurality of adjacent ESD clamp devices comprises forming a plurality of adjacent voltage clamps.

15. A system, comprising:
    a transmitter;
    a receiver; and
    at least one multiple-finger ESD protection device coupled to an input or an output of the transmitter and a reference potential, wherein the at least one multiple-finger ESD protection device includes a plurality of adjacent ESD clamp devices oriented in a first direction, wherein each ESD clamp device of the plurality of adjacent ESD clamp devices includes an I/O pad configured to be coupled to the input or the output of the transmitter and a contact configured to be coupled to the reference potential, and
    a plurality of the contacts associated with the plurality of adjacent ESD clamp devices, wherein the plurality of contacts is oriented in a second direction that is perpendicular to the first direction, wherein each of the plurality of contacts is connected to two or more of the plurality of adjacent ESD clamp devices.

16. The system of claim 15, further comprising at least a second multiple-finger ESD protection device coupled to an input or an output of the receiver and the reference potential.

17. The system of claim 15, wherein the system comprises a transceiver formed on a semiconductor wafer, chip, integrated circuit or die.

18. A system, comprising:
    a level shift;
    a decode/drive; and
    at least one multiple-finger ESD protection device coupled to an input of the level shift and a reference potential, wherein the at least one multiple-finger ESD protection device includes a plurality of adjacent ESD clamp devices oriented in a first direction, wherein each ESD clamp device of the plurality of adjacent ESD clamp devices includes an I/O pad configured to be coupled to the input of the level shift, and a contact configured to be coupled to the reference potential; and
    a plurality of the contacts associated with the plurality of adjacent ESD clamp devices, wherein the plurality of contacts is oriented in a second direction that is perpendicular to the first direction, wherein each of the plurality of contacts is connected to two or more of the plurality of adjacent ESD clamp devices.

19. The system of claim 18, further comprising at least a second multiple-finger ESD protection device coupled to an input or an output of the system and the reference potential.

20. The system of claim 18, wherein the system comprises an analog switch configured as a multiplexer/demultiplexer (MUX) switch formed on a semiconductor wafer, chip, integrated circuit or die.

* * * * *